(12) United States Patent
Huang et al.

(10) Patent No.: US 8,686,500 B2
(45) Date of Patent: Apr. 1, 2014

(54) DOUBLE DIFFUSED METAL OXIDE SEMICONDUCTOR DEVICE AND MANUFACTURING METHOD THEREOF

(75) Inventors: Tsung-Yi Huang, Hsinchu (TW); Ching-Yao Yang, Changhua (TW)

(73) Assignee: Richtek Technology Corporation, Chupei, Hsin-Chu (TW)

(*) Notice: Subject to any disclaimer, the term of this patent is extended or adjusted under 35 U.S.C. 154(b) by 0 days.

(21) Appl. No.: 13/476,043

(22) Filed: May 21, 2012

(65) Prior Publication Data
US 2013/0307072 A1    Nov. 21, 2013

(51) Int. Cl.
*H01L 29/76* (2006.01)
*H01L 31/062* (2012.01)

(52) U.S. Cl.
USPC ........... 257/335; 257/336; 257/339; 257/343; 438/270; 438/271; 438/279; 438/294

(58) Field of Classification Search
USPC .................. 257/335–336, 339, 343, E21.417, 257/E21.615, E29.256; 438/270–271, 279, 438/294
See application file for complete search history.

(56) References Cited

U.S. PATENT DOCUMENTS

2004/0238913 A1*   12/2004   Kwon et al. .................. 257/492

* cited by examiner

*Primary Examiner* — Theresa T. Doan
(74) *Attorney, Agent, or Firm* — Tung & Associates (57) ABSTRACT

The present invention discloses a double diffused metal oxide semiconductor (DMOS) device and a manufacturing method thereof. The DMOS device is formed in a first conductive type substrate, and includes a second conductive type high voltage well, a field oxide region, a gate, a second conductive type source, a second conductive type drain, a first conductive type body region, and a first conductive type deep well. The deep well is formed beneath and adjacent to the high voltage well in a vertical direction. The deep well and the high voltage well are defined by a same lithography process step.

10 Claims, 7 Drawing Sheets

DOUBLE DIFFUSED METAL OXIDE SEMICONDUCTOR DEVICE AND MANUFACTURING METHOD THEREOF

BACKGROUND OF THE INVENTION

1. Field of Invention

The present invention relates to a double diffused metal oxide semiconductor (DMOS) device and a manufacturing method thereof; particularly, it relates to such DMOS device and manufacturing method wherein the breakdown voltage is increased.

2. Description of Related Art

Figure 1A:
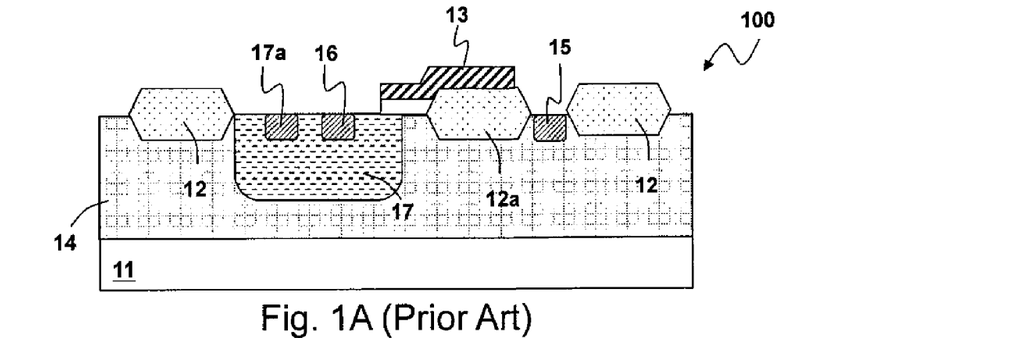
FIG. 1A is a cross-section view of a prior art double diffused drain metal oxide semiconductor (DDDMOS) device 100.
Figure 1B:
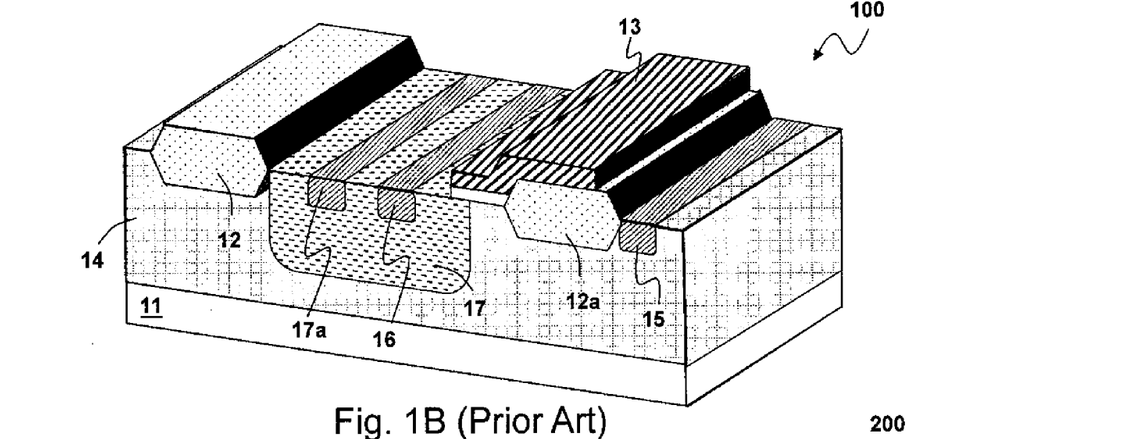
FIG. 1B is a 3D (3-dimensional) view of a prior art DMOS device 100.

FIGS. 1A-1B show a cross-section view and a 3D (3-dimensional) view of a prior art double diffused metal oxide semiconductor (DMOS) device 100 respectively. As shown in FIGS. 1A and 1B, a P-type substrate 11 has multiple isolation regions 12 by which a device region of the DMOS device 100 is defined. The isolation regions 12 and a field oxide layer 12 for example are a local oxidation of silicon (LOCOS) structure or a shallow trench isolation (STI) structure, the former being shown in the figures. The DMOS device 100 includes an N-type well 14, a gate 13, a drain 15, a source 16, a body region 17, a body electrode 17a, and the field oxide layer 12a. The well 14, drain 15 and the source 16 are formed by lithography process steps and ion implantation process steps, wherein the lithography process step defines the implantation region by a photoresist mask together with a self-alignment effect provided by all or part of the gate 13, and the ion implantation process step implants N-type impurities to the defined region in the form of accelerated ions. The drain 15 and the source 16 are beneath the gate 13 and at different sides thereof respectively. The body region 17 and the body electrode 17a are formed by lithography process steps and ion implantation process steps, wherein the lithography process step defines the implantation region by a photoresist mask together with a self-alignment effect provided by all or part of the gate 13, and the ion implantation process step implants P-type impurities to the defined region in the form of accelerated ions. Part of the gate 13 is above the isolation region 12 in the DMOS device 100.

The DMOS device is a high voltage device designed for applications requiring higher operation voltages. However, if it is required for the DMOS device to be integrated with a low voltage device in one substrate, the DMOS device and the low voltage device should adopt the same manufacturing process steps with the same ion implantation parameters, or the DMOS device is required to be manufactured in a non-epitaxial silicon substrate, and thus the flexibility of the ion implantation parameters or the performance for the DMOS device is limited; as a result, the DMOS device will have a lower breakdown voltage and therefore a limited application range. To increase the breakdown voltage of the DMOS device, additional manufacturing process steps are required, or as a typical high voltage device, an epitaxial silicon substrate is provided; that is, an additional lithography process step and an additional ion implantation process step in order to provide different ion implantation parameters are required, or a more expensive substrate is required, but both ways increase the cost.

In view of above, to overcome the drawbacks in the prior art, the present invention proposes a DMOS device and a manufacturing method thereof which increases the breakdown voltage so that the DMOS device may have a broader application range, in which an additional lithography process step and the epitaxial substrate are not required such that the DMOS device can be integrated with and a low voltage device and manufactured by common manufacturing process steps.

TOTAL OF THE INVENTION

A first objective of the present invention is to provide a double diffused metal oxide semiconductor (DMOS) device.

A second objective of the present invention is to provide a manufacturing method of a DMOS device.

To achieve the objectives mentioned above, from one perspective, the present invention provides a DMOS device, which is formed in a first conductive type substrate, wherein the substrate has an upper surface. The DMOS device includes: a second conductive type high voltage well, which is formed beneath the upper surface; a field oxide region, which is formed on the upper surface, and is located in the high voltage well from top view; a gate, which is formed on the upper surface, wherein part of the gate is above the field oxide region; a second conductive type source and a second conductive type drain, which are formed at two sides of the gate beneath the upper surface respectively, wherein the drain and the source are separated by the gate and the field oxide region from top view, and the drain is formed in the high voltage well; a first conductive type body region, which is formed in the substrate beneath the upper surface, wherein the source is in the body region; and a first conductive type deep well, which is formed beneath and adjacent to the high voltage well in a vertical direction, wherein the deep well is defined by a same lithography process step as the high voltage well.

From another perspective, the present invention provides a manufacturing method of a DMOS device, including: providing a first conductive type substrate wherein the substrate has an upper surface; forming a second conductive type high voltage well beneath the upper surface; forming a first conductive type deep well beneath and adjacent to the high voltage well in a vertical direction, wherein the deep well is defined by a same lithography process step as the high voltage well; forming a field oxide region on the upper surface, and in the high voltage well from top view; forming a gate on the upper surface, wherein part of the gate is above the field oxide region; forming a second conductive type source and a second conductive type drain at two sides of the gate beneath the upper surface respectively, wherein the drain and the source are separated by the gate and the field oxide region from top view, and the drain is formed in the high voltage well; and forming a first conductive type body region in the substrate beneath the upper surface, wherein the source is in the body region.

In one embodiment, the body region and the substrate may be separated by the high voltage well, such that the body region is not directly connected to the substrate.

In another embodiment, at least part of the body region may be directly connected to the substrate, or connected to the substrate via a first conductive type connecting well, such that the body region is electrically connected to the substrate.

In another embodiment, the substrate preferably includes a non-epitaxial silicon substrate.

In another embodiment, the substrate may include an epitaxial layer, wherein the high voltage well and the body region are formed in the epitaxial layer.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 2A:
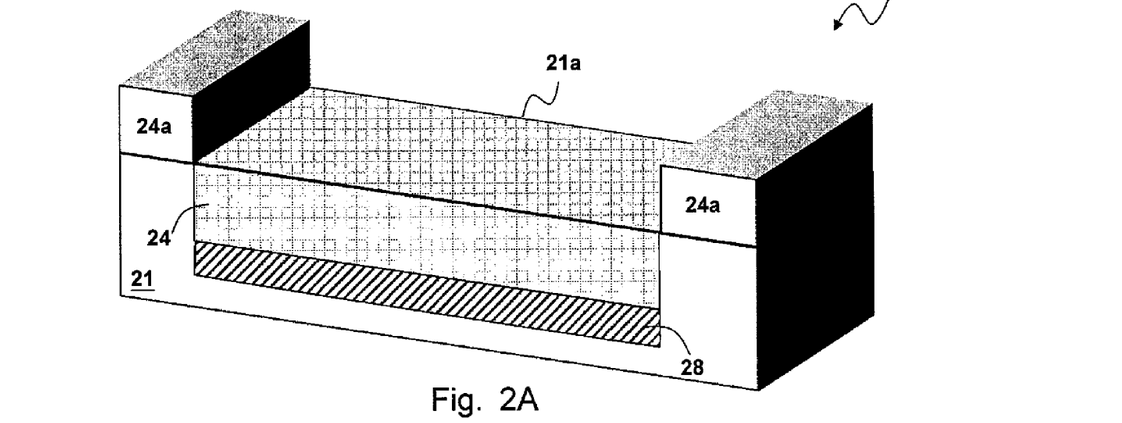
FIGS. 2A-2C show a first embodiment of the present invention.
Figure 2B:
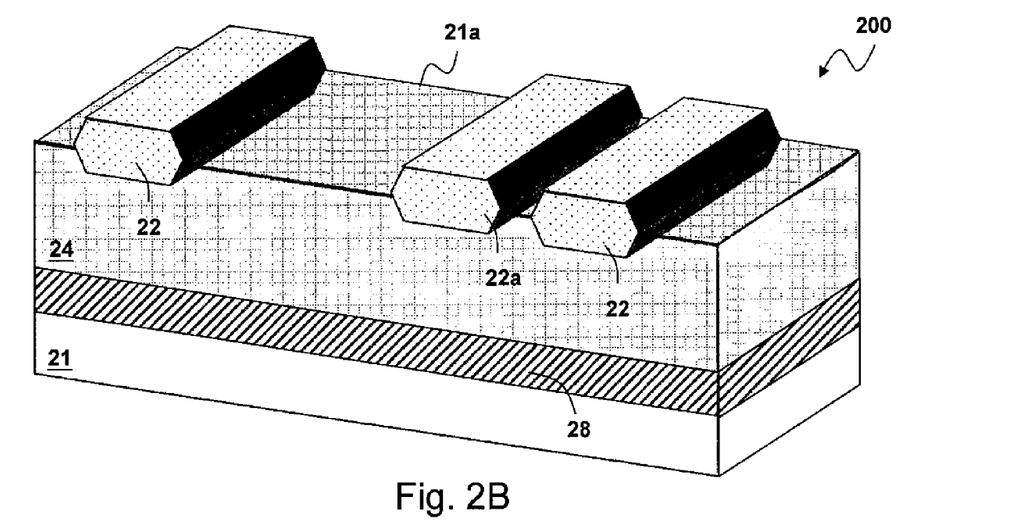
Figure 2C:
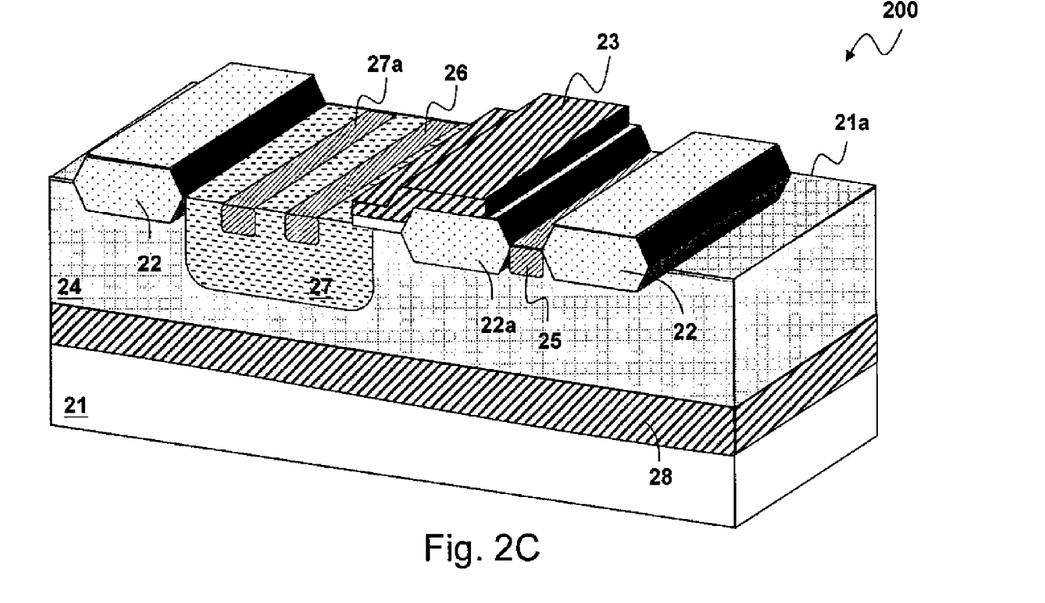

Please refer to FIGS. 2A-2C for a first embodiment according to the present invention, wherein FIGS. 2A-2C are 3D schematic diagrams showing a manufacturing method of a DMOS device 200 according to the present invention. As shown in FIG. 2A, first, a substrate 21 with an upper surface 21a is provided, wherein the substrate 21 is for example but not limited to a P-type substrate (or an N-type substrate in another embodiment), and the substrate 21 is preferably a non-epitaxial silicon substrate, but it also can be an epitaxial substrate. Next, an N-type high voltage well 24 and a P-type deep well 28 are formed beneath the upper surface 21a by a lithography process step and ion implantation process steps, wherein the lithography process step defines the implantation region by a photoresist mask 24a, and the ion implantation process steps implant N-type and P-type impurities to the defined region in the form of accelerated ions respectively. The order of the ion implantation process steps for the N-type high voltage well 24 and the P-type deep well 28 may be interchanged. Note that even though the high voltage well 24 and the deep well 28 are formed by different ion implantation process steps, they are defined by the same photoresist mask 24a with the same lithography process step, such that the cost can be reduced. Besides, as shown in the figure, the deep well 28 is formed beneath and adjacent to the high voltage well 24 in a vertical direction.

Next, as shown in FIG. 2B, isolation regions 22 and a field oxide region 22a are formed on the upper surface 21a, wherein the isolation regions 22 and the field oxide region 22a are, for example, a LOCOS or an STI structure (the former being shown in FIGS. 2B-2C). The isolation region 22 and the field oxide region 22a may be formed by for example but not limited to the same process steps; the field oxide region 22a is located in the high voltage well 24 from top view (not shown). Next, as shown in FIG. 2C, a gate 23, a drain 25, a source 26, a body region 27, and a body electrode 27 are formed. As shown in the figure, the gate 23 is formed on the upper surface 21a, wherein part of the gate 23 is above the field oxide region 22a. The drain 25 and the source 26 for example are N-type but not limited to N-type, and they are beneath the upper surface 21a and at different sides of the gate 23. The drain 25 and the source 26 are separated by the gate 23 and the field oxide region 22a from top view (not shown), wherein the drain 25 is located in the high voltage well 24. The body region 27 for example is P-type but not limited to P-type, and it is formed in the substrate 21 beneath the upper surface 21a. The source 26 is located in the body region 27.

This embodiment is different from the prior art in that, the deep well 28 is beneath and adjacent to the high voltage well 24. This arrangement is advantageous over the prior art in that: First, the DMOS device of the present invention has better characteristics because the present invention enhances the breakdown voltage of the DMOS device. Second, in manufacturing process, no additional lithography process step or mask is required, that is, the deep well 28 and the high voltage well 24 may be formed by the same lithography process steps without additional mask and lithography process step. As such, the DMOS device in the present invention has a better breakdown voltage while it can be manufactured by a low cost. The detailed reasons for better characteristics will be described later.

Figure 3:
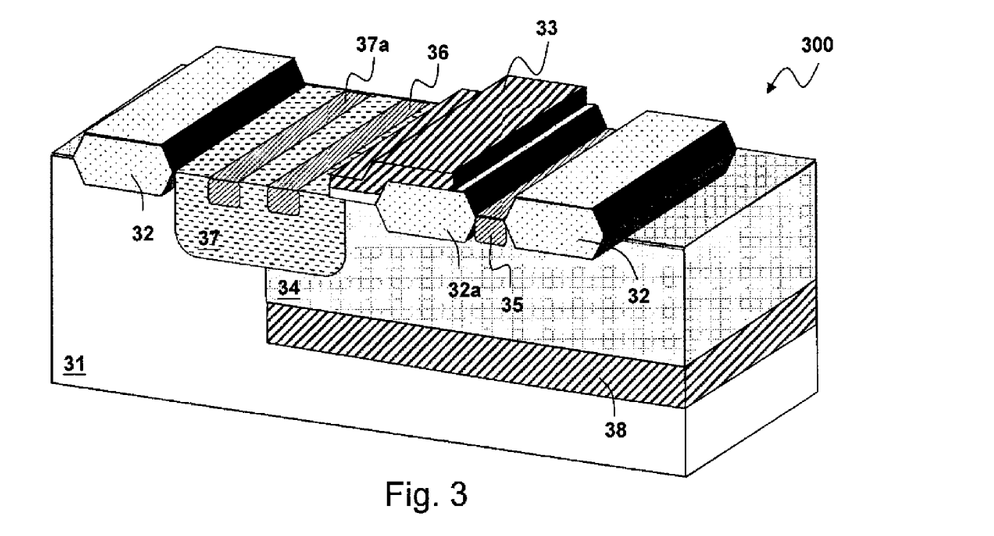
FIG. 3 shows a second embodiment of the present invention.

FIG. 3 is a schematic diagram showing a 3D view of a DMOS device 300 of the present invention, which is a second embodiment of the present invention different from the first embodiment. In the first embodiment, the body region 27 and the substrate 21 are separated by the high voltage well 24 such that the body region 27 is not directly connected to the substrate 21, and therefore the DMOS device 200 may be used, for example, as a high side device in a power supply circuit. On the other hand, as shown in the figure, the DMOS device 300 formed in a substrate 31 of this embodiment includes a device region defined by the isolation regions 32, and the DMOS device 300 includes a field oxide region 32, a gate 33, a drain 35, a source 36, a body region 37, and a body electrode 37a. Different from the first embodiment, part of the body region 37 of this embodiment is directly connected to the substrate 31, such that the body region 37 is electrically connected to the substrate 31, and therefore the DMOS device 300 may be used, for example, as a low side device in a power supply circuit.

Figure 4:
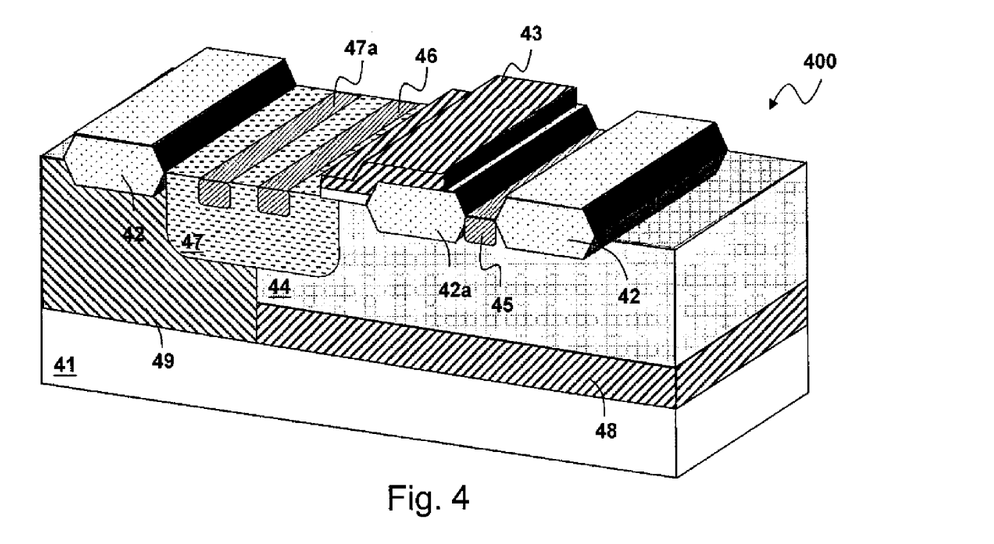
FIG. 4 shows a third embodiment of the present invention.

FIG. 4 shows a third embodiment of the present invention. FIG. 4 is a schematic diagram showing a 3D view of a DMOS device 400 of the present invention. As shown in the figure, the DMOS device 400 formed in a substrate 41 of this embodiment includes a device region defined by the isolation regions 42, and the DMOS device 400 includes a field oxide region 42, a gate 43, a drain 45, a source 46, a body region 47, and a body electrode 47a. Different from the second embodiment, part of the body region 47 of this embodiment is connected to a P-type connecting well 49 and the P-type connecting well 49 is further connected to the substrate 41, such that the body region 47 is electrically connected to the substrate 41, and therefore the DMOS device 300 may be used as a low side device in a power supply circuit.

Figures 5A, 5B:
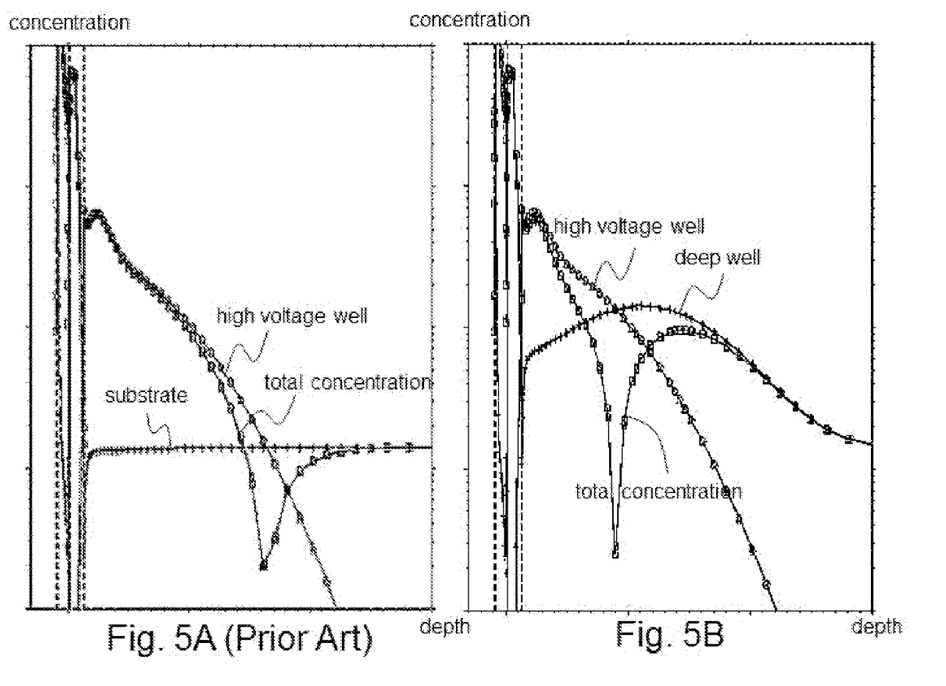
FIGS. 5A-5B show simulated secondary ion mass spectrometry (SIMS) profiles of the prior art and the present invention DMOS devices respectively.

FIGS. 5A-5B show simulated secondary ion mass spectrometry (SIMS) profiles of the prior art and the present invention DMOS devices, respectively. Comparing FIG. 5A with FIG. 5B, the concentration distribution curves of the high voltage wells are similar because the prior art and the present invention use the same ion implantation parameters for forming the high voltage wells. In FIG. 5A, the total concentration distribution curve indicates the total carriers density in the high voltage well and the substrate; on the other hand, in FIG. 5B, the total concentration distribution curve indicates the total carriers density in the high voltage well and the deep well (in FIG. 5B, the carriers concentration of the substrate can be omitted as compared to the carriers concentration of the deep well), which is higher than the curve of FIG. 5A. This shows that, in the present invention, a depletion region will be formed at the junction between the high voltage well and the deep well, i.e., a depletion region will be formed from the bottom of the high voltage well, such that the breakdown voltage of the DMOS device is increased. More specifically, when the DMOS device according to the present invention operates, especially in the OFF condition, the depletion region formed from the bottom of the high voltage well will combine with a lateral depletion region formed during the operation of the device, such that an enlarged depletion region is formed in the drift region of the DMOS device, and therefore, a high electric field is mitigated because of a reduce surface field (RESURF) effect, i.e., the breakdown voltage is increased.

Besides, FIGS. 5A and 5B also explain what it means by that "the deep well is adjacent to the high voltage well in the vertical direction" as a practical meaning. Ion implantations produce distributions of impurities, so implantations of the high voltage well and the deep well form two concentration distribution curves. The highest concentration part of the high voltage well and the highest concentration part of the deep well are located at different depths. Because the deep well is adjacent to the high voltage well, the concentration distribution curves of the high voltage well and the deep well overlap with each other in the vertical direction. The depletion region is formed in the overlapped region when the DMOS device operates (especially in the OFF condition). Below the overlapped region, the deep well has the first conductive type (P-type in the aforementioned embodiments).

Figure 6A:
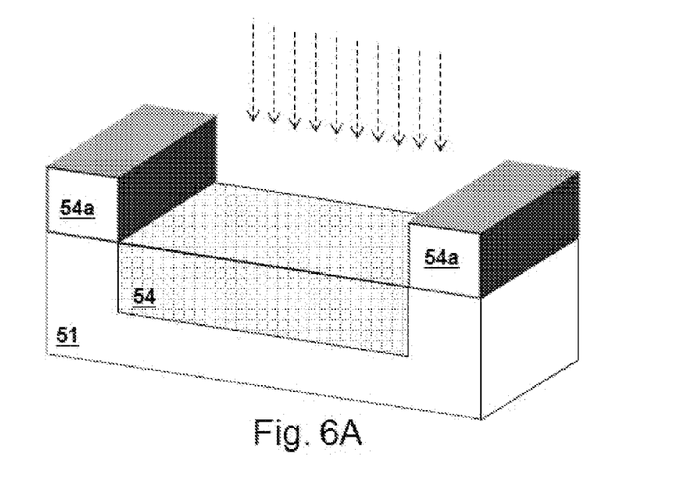
FIGS. 6A-6B show another embodiment of the present invention.
Figure 6B:
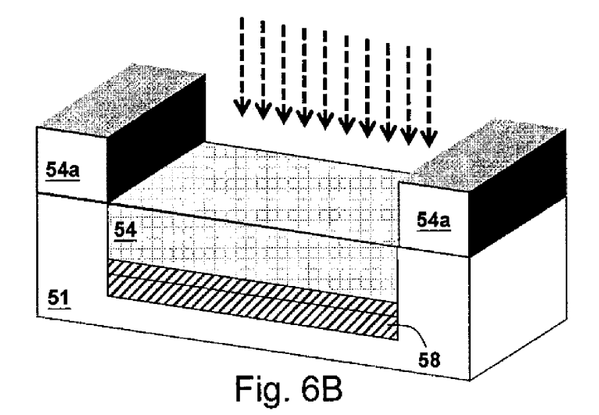
Figure 7A:
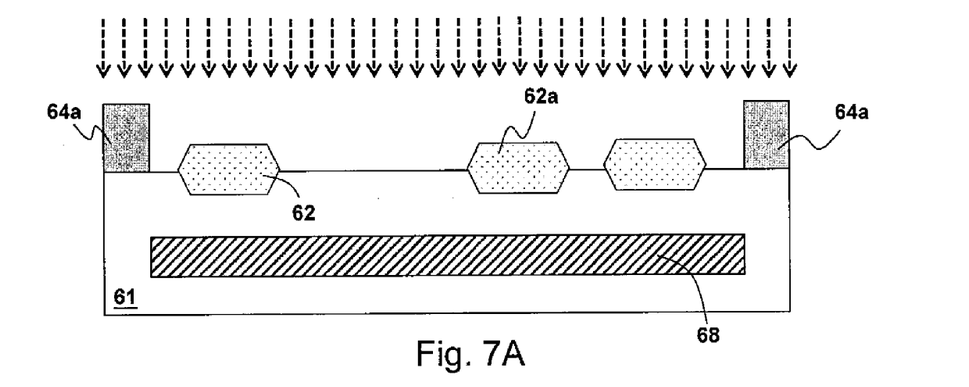
FIGS. 7A-7B show another embodiment of the present invention.
Figure 7B:
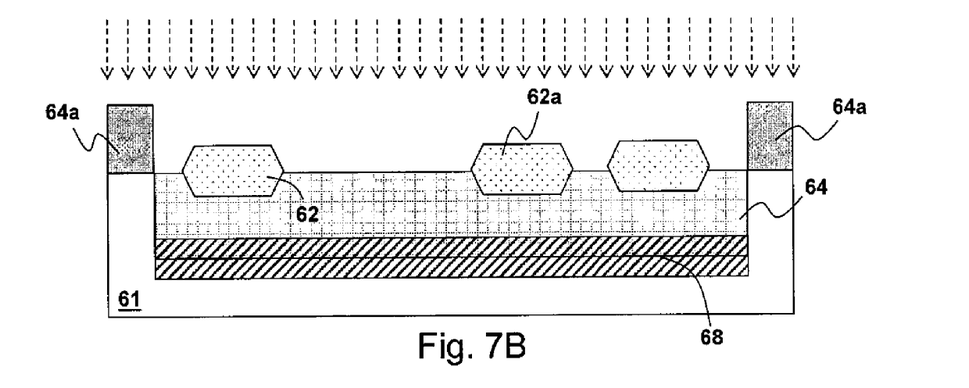

The high voltage well and the deep well are defined by the same mask, and the steps of forming the high voltage well and the deep well can be interchanged, i.e., either the high voltage well or the deep well can be formed first. Besides, the high voltage well and the deep well can be formed before or after forming the field oxide region. FIGS. 6A and 6B show an embodiment wherein the high voltage well and the deep well are formed before the field oxide region is formed. A second conductive type high voltage well 54 is formed by a lithography process step and an ion implantation process step, wherein the lithography process step defines the implantation region by a photoresist mask 54a, and the ion implantation process step implants the second conductive type impurities to the defined region in the form of accelerated ions as indicated by the dashed arrow lines in the first conductive type substrate 51. Next, as shown in FIG. 6B, a first conductive type deep well 58 is formed beneath the high voltage well 54 by the same photoresist mask 54a, and the ion implantation process step implants the first conductive type impurities to the defined region in the form of accelerated ions as indicated by the dashed arrow lines. FIGS. 7A and 7B show an embodiment wherein the high voltage well and the deep well are formed after the isolation regions 62 and the field oxide region 62a are formed. With the same photoresist masks 64a, a first conductive type deep well 68 is formed by the ion implantation process step, which implants the first conductive type impurities to the defined region in the form of accelerated ions as indicated by the dashed arrow lines in the first conductive type substrate 61 as shown in FIG. 7A, and next, a second conductive type high voltage well 64 is formed upon the deep well 68 by an ion implantation process step, which implants the second conductive type impurities to the defined region in the form of accelerated ions as indicated by the dashed arrow lines as shown in FIG. 7B. The above shows that there are various ways to embody the concept of the present invention.

Figure 8A:
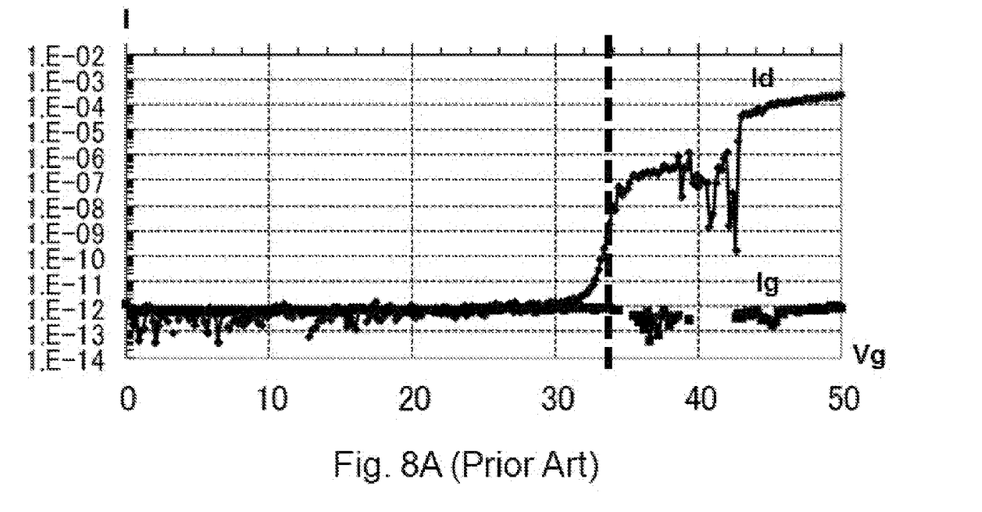
FIGS. 8A-8B show characteristic curves of the prior art DMOS device.
Figure 8B:
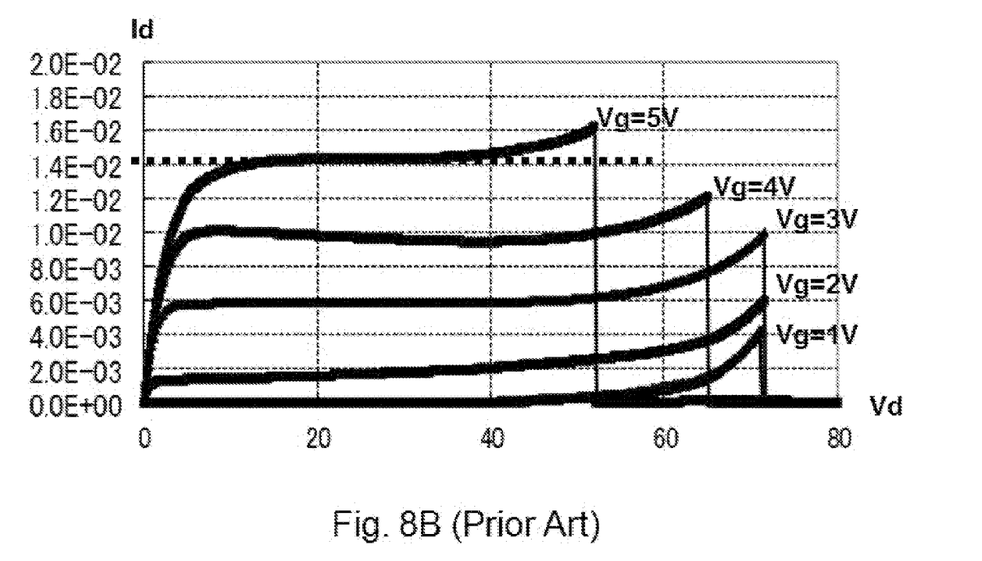

FIGS. 8A-8B show characteristic curves of a prior art DMOS device, wherein a 36V voltage is applied to the drain in the ON operation in FIG. 8A. FIG. 8A shows characteristic curves of a drain current Id and a gate current Ig versus a gate voltage Vg of the prior art DMOS device in the OFF operation. The breakdown voltage of the prior art DMOS device in the OFF operation is around 34V, as indicated by the dash line shown in the figure. FIG. 8B shows characteristic curves of the drain current Id versus a drain voltage Vd at different gate voltages of the prior art DMOS device in the ON operation. The drain current Id of the prior art DMOS device is around 14 mA as indicated by the dash line when the gate voltage Vg is 5V.

Figure 9A:
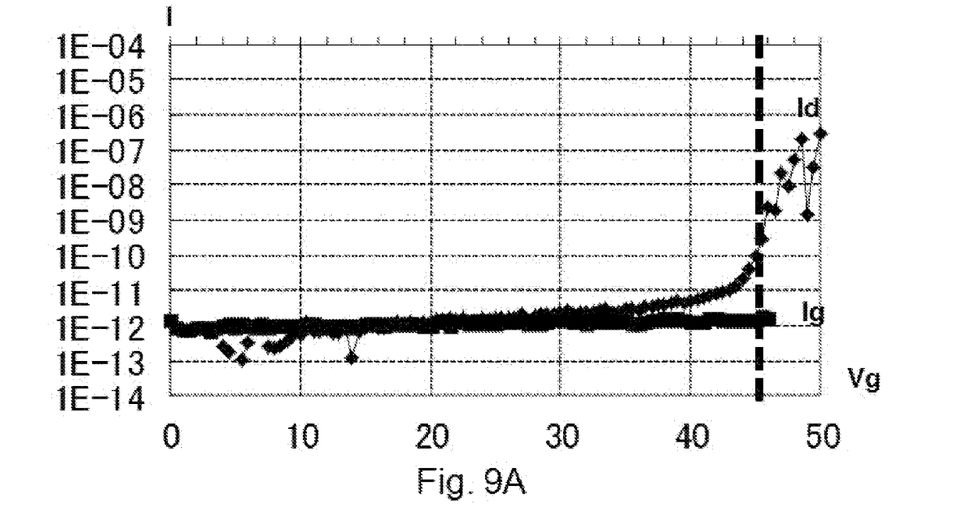
FIGS. 9A-9B show characteristic curves of the DMOS device of the present invention.
Figure 9B:
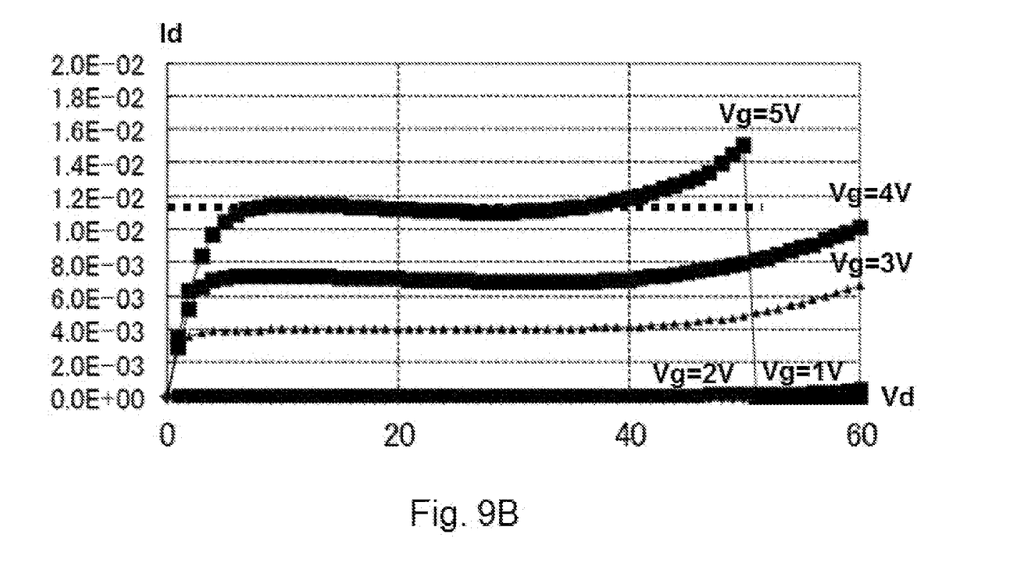

FIGS. 9A-9B show characteristic curves of the DMOS device according to the present invention, wherein a 36V voltage is applied to the drain in the ON operation in FIG. 9A. FIG. 9A shows characteristic curves of the drain current Id and the gate current Ig versus the gate voltage Vg of the DMOS device according to the present invention in the OFF operation. The breakdown voltage of the DMOS device according to the present invention in the OFF operation is around 45V, as indicated by the dash line shown in the figure. FIG. 9B shows characteristic curves of the drain current Id versus the drain voltage Vd at different gate voltages of the DMOS device in the ON operation. The drain current Id of the DMOS device according to the present invention is slightly lower than 12 mA as indicated by the dash line when the gate voltage Vg is 5V.

Comparing FIGS. 8A-8B and FIGS. 9A-9B, the breakdown voltage of the DMOS device can be significantly increased by the present invention with only little sacrifice of the conductive current (Id); besides, the cost can be significantly reduced by using a non-epitaxial silicon substrate, with only adding a small cost of an ion implantation step for forming the deep well. The significantly increased breakdown voltage and the significantly reduced cost are the advantages of the present invention over the prior art.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography, X-ray lithography, etc. In view of the foregoing, the spirit of the present invention should cover all such and other modifications and variations, which should be interpreted to fall within the scope of the following claims and their equivalents.

What is claimed is:

1. A double diffused metal oxide semiconductor (DMOS) device formed in a first conductive type substrate, wherein the substrate has an upper surface, the DMOS device comprising:
    a second conductive type high voltage well, which is formed beneath the upper surface;
    a field oxide region, which is formed on the upper surface, and is located in the high voltage well from top view;
    a gate, which is formed on the upper surface, wherein part of the gate is above the field oxide region;
    a second conductive type source and a second conductive type drain, which are formed at two sides of the gate beneath the upper surface respectively, wherein the drain and the source are separated by the gate and the field oxide region from top view, and the drain is formed in the high voltage well;

a first conductive type body region, which is formed in the substrate beneath the upper surface, wherein the source is in the body region; and a first conductive type deep well, which is formed beneath and adjacent to the high voltage well in a vertical direction, wherein the deep well is defined by a same lithography process step as the high voltage well, and the deep well and the high voltage well have a same area size from top view.

2. The DMOS device of claim 1, wherein the body region and the substrate are separated by the high voltage well, such that the body region is not directly connected to the substrate.

3. The DMOS device of claim 1, wherein at least part of the body region is directly connected to the substrate, or connected to the substrate via a first conductive type connecting well, such that the body region is electrically connected to the substrate.

4. The DMOS device of claim 1, wherein the substrate includes a non-epitaxial silicon substrate.

5. The DMOS device of claim 1, wherein the substrate includes an epitaxial layer, wherein the high voltage well and the body region are formed in the epitaxial layer.

6. A manufacturing method of a double diffused metal oxide semiconductor (DMOS) device comprising:

providing a first conductive type substrate wherein the substrate has an upper surface;

forming a second conductive type high voltage well beneath the upper surface;

forming a first conductive type deep well beneath and adjacent to the high voltage well in a vertical direction, wherein the deep well is defined by a same lithography process step as the high voltage well;

forming a field oxide region on the upper surface, and in the high voltage well from top view;

forming a gate on the upper surface, wherein part of the gate is above the field oxide region;

forming a second conductive type source and a second conductive type drain at two sides of the gate beneath the upper surface respectively, wherein the drain and the source are separated by the gate and the field oxide region from top view, and the drain is formed in the high voltage well; and forming a first conductive type body region in the substrate beneath the upper surface, wherein the source is in the body region.

7. The manufacturing method of claim 6, wherein the body region and the substrate are separated by the high voltage well, such that the body region is not directly connected to the substrate.

8. The manufacturing method of claim 7, wherein at least part of the body region is directly connected to the substrate, or connected to the substrate via a first conductive type connecting well, such that the body region is electrically connected to the substrate.

9. The manufacturing method of claim 6, wherein the substrate includes a non-epitaxial silicon substrate.

10. The manufacturing method of claim 6, wherein the substrate may include an epitaxial layer, wherein the high voltage well and the body region are formed in the epitaxial layer.

* * * * *